(12) United States Patent
Shafer et al.

(10) Patent No.: US 6,842,298 B1
(45) Date of Patent: Jan. 11, 2005

(54) BROAD BAND DUV, VUV LONG-WORKING DISTANCE CATADIOPTRIC IMAGING SYSTEM

(75) Inventors: David R. Shafer, Fairfield, CT (US); Yung-Ho Chuang, Cupertino, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 425 days.

(21) Appl. No.: 09/796,117

(22) Filed: Feb. 28, 2001

Related U.S. Application Data (60) Provisional application No. 60/231,761, filed on Sep. 12, 2000.

(51) Int. Cl.[7] .......................... G02B 17/08; G02B 21/04
(52) U.S. Cl. ......................... 359/730; 359/365; 359/656
(58) Field of Search ................................ 359/726–736, 359/364–366, 656–661

(56) References Cited

U.S. PATENT DOCUMENTS

| | | | |
|---|---|---|---|
| 1,973,066 A | 9/1934 | Hauser et al. ............... 359/390 |
| 2,661,658 A | 12/1953 | Dyson ........................ 359/727 |
| 3,237,515 A | 3/1966 | Altman ....................... 356/391 |
| 4,758,088 A | 7/1988 | Doyle |
| 4,779,966 A | 10/1988 | Friedman |
| 4,795,244 A | 1/1989 | Uehara |
| 4,898,471 A | 2/1990 | Vaught et al. |
| 4,971,428 A | 11/1990 | Moskovich |
| 4,974,094 A | 11/1990 | Morito |
| 5,031,976 A | 7/1991 | Shafer |
| 5,052,763 A | 10/1991 | Singh et al. |
| 5,089,913 A | 2/1992 | Singh et al. |
| 5,114,238 A | 5/1992 | Sigler |
| 5,140,459 A | 8/1992 | Sagan |
| 5,177,559 A | 1/1993 | Batchelder et al. |
| 5,323,263 A | 6/1994 | Schoenmakers |
| 5,428,442 A | 6/1995 | Lin et al. |
| 5,488,229 A | 1/1996 | Elliott et al. |
| 5,515,207 A | 5/1996 | Foo |
| 5,636,066 A | 6/1997 | Takahashi |
| 5,644,140 A | 7/1997 | Biedermann et al. |
| 5,668,673 A | 9/1997 | Suenaga et al. |
| 5,717,518 A | 2/1998 | Shafer et al. |
| 5,805,334 A | 9/1998 | Takahashi |
| 5,805,356 A | * 9/1998 | Chiba ......................... 359/727 |
| 5,805,357 A | 9/1998 | Omura |
| 5,808,805 A | 9/1998 | Takahashi |
| 5,835,275 A | 11/1998 | Takahashi et al. |
| 5,861,997 A | 1/1999 | Takahashi |
| 5,880,891 A | 3/1999 | Furter |
| 5,999,310 A | 12/1999 | Shafer et al. |
| 6,064,517 A | 5/2000 | Chuang et al. |
| 6,169,627 B1 | * 1/2001 | Schuster ..................... 359/364 |
| 6,377,338 B1 | * 4/2002 | Suenaga ...................... 355/67 |
| 6,512,631 B2 | * 1/2003 | Shafer et al. ............... 359/355 |
| 6,560,039 B1 | * 5/2003 | Webb et al. ................. 359/731 |
| 6,600,608 B1 | * 7/2003 | Shafer et al. ............... 359/729 |

FOREIGN PATENT DOCUMENTS

| | | | | |
|---|---|---|---|---|
| DE | 108181 | 1/1900 | | |
| DE | 3742806 | 7/1989 | | |
| EP | 0798585 | 10/1997 | | |
| EP | 1098215 A1 | * 5/2001 | ........... G02B/17/08 |
| GB | 2269024 | 1/1994 | | |
| WO | 9712226 | 4/1997 | | |
| WO | 9908134 | 2/1999 | | |

OTHER PUBLICATIONS

Smith, Modern Optical Engineering: The Design of Optical Systems, 3rd Ed., McGraw–Hill 2000, p. 487.*
M.R. Bartz et al., "LED Print Analyzer," IBM Technical Disclosure Bulletin, vol. 14, No. 3, Aug. 1971.
D.S. Goodman, "Darkfield Illuminator Attachment," IBM Technical Disclosure Bulletin, vol. 27, No. 5, Oct. 1984.
J.L.C. Sanz et al., "Automated Visual Inspection with Dark–Field Microscopy," Journal of the Optical Society of America, Nov. 1985, USA, vol. 2, No. 11, pp. 1857–1862.

* cited by examiner

*Primary Examiner*—Scott J. Sugarman
*Assistant Examiner*—Deborah A. Raizen
(74) *Attorney, Agent, or Firm*—Smyrski & Livesay, LLP (57) ABSTRACT

A high performance objective having very small central obscuration, an external pupil for apertureing and Fourier filtering, loose manufacturing tolerances, large numerical aperture, long working distance, and a large field of view is presented. The objective is preferably telecentric. The design is ideally suited for both broad-band bright-field and laser dark field imaging and inspection at wavelengths in the UV to VUV spectral range.

38 Claims, 8 Drawing Sheets

BROAD BAND DUV, VUV LONG-WORKING DISTANCE CATADIOPTRIC IMAGING SYSTEM

This application claims the benefit of U.S. Provisional Patent Application No. 60/231,761, filed Sep. 12, 2000.

BACKGROUND OF THE INVENTION

1. Field of the Invention

The present invention relates generally to the field of optical imaging and more particularly to catadioptric optical systems used for microscopic imaging, inspection, and lithography applications.

2. Description of the Related Art

Many optical and electronic systems exist to inspect surface features for defects such as those on a partially fabricated integrated circuit or a photomask. Defects may take the form of particles randomly localized on the surface, scratches, process variations, and so forth. Such techniques and devices are well known in the art and are embodied in various commercial products such as many of those available from KLA-Tencor Corporation of San Jose, Calif., the assignee of the present application.

Figure 1:
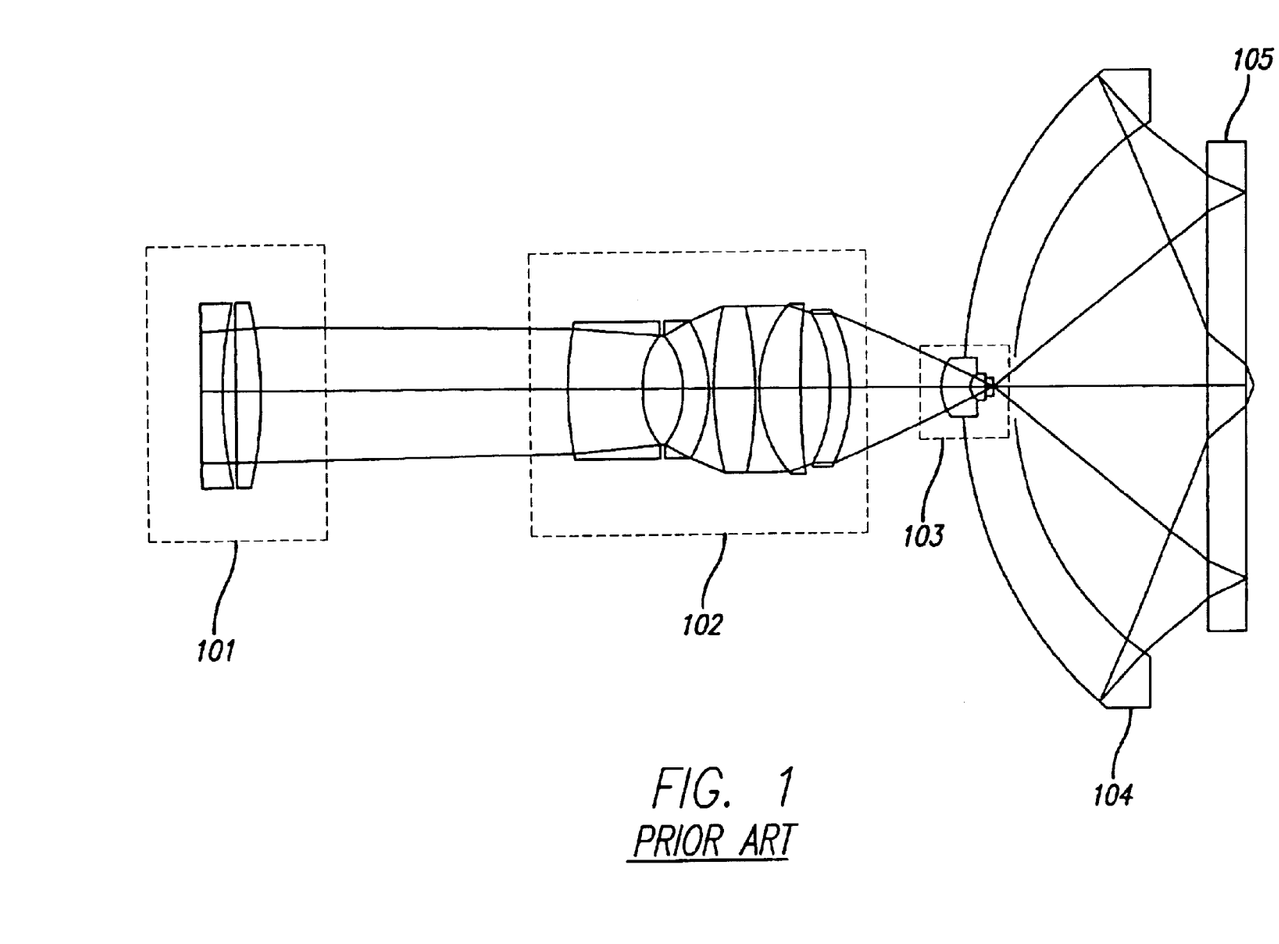
FIG. 1 presents a previous catadioptric imaging design.

Specialized optical systems are required to enable the imaging and inspection of surface defects, such as those found on semiconductor wafers and photomasks. Two prior inventions describe high numerical aperture (NA) catadioptric systems that can support this type of imaging. These inventions are U.S. Pat. No. 5,717,518 to Shafer et al., as shown in FIG. 1, and U.S. Pat. No. 6,064,517, also to Shafer et al.

U.S. Pat. No. 5,717,518 to Shafer et al. describes an apparatus capable of high NA, ultra broadband UV imaging. The '518 patent describes a 0.9 NA system that can be used for broadband bright field and multiple wavelength darkfield imaging. It has ultra broad band chromatic correction using an achromatized field lens. This system can employ an achromatized field lens group to correct for secondary and higher order lateral color. This type of design has several limitations including a limited working distance, central obscuration, internal pupil, and some relatively tight manufacturing tolerances. The tight manufacturing tolerances mainly come from the balance of the large spherical aberration generated from the catadioptric group.

Figure 2:
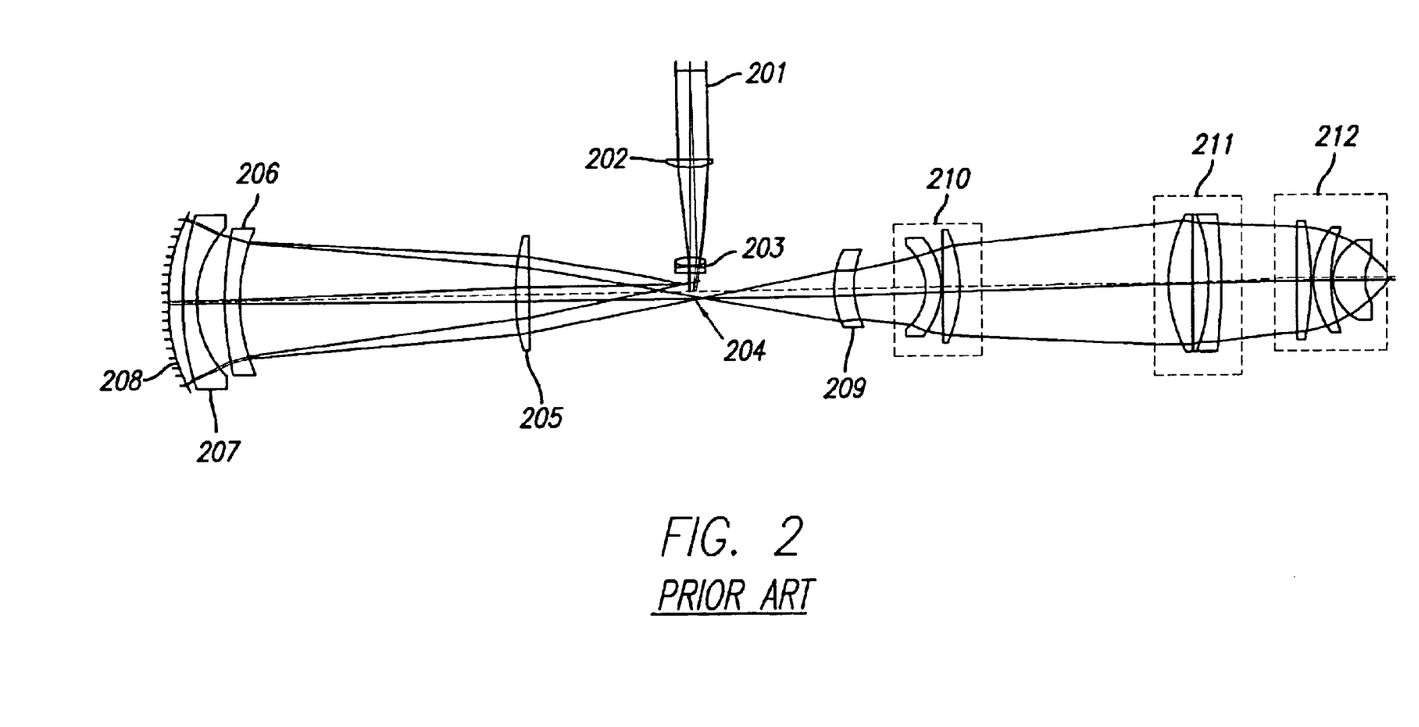
FIG. 2 is another previous catadioptric imaging design.

U.S. patent application Ser. No. 09/349,036 filed on Jul. 7, 1999 to Shafer et al., as shown in FIG. 2, describes a high NA optical apparatus that has several advantages including a long-working distance, zero central obscuration, external pupil, and a relatively loose manufacturing tolerance. The system presented in the '036 application is ideally suited for use in long-working distance imaging applications, such as reticle inspection and lithography. This design is highly applicable for use in both 193 nm and 157 nm generation inspection and lithography applications. The design shown has a high degree of chromatic correction using a single glass material. Further chromatic correction is possible using two glass materials. This design has a long overall optical path, which in certain circumstances can adversely affect mechanical stability and manufacturing costs. Also, the optical system has an unusual optical axis near perpendicular that can offer manufacturing challenges.

Other specialized catadioptric optical systems have been developed for use in semiconductor lithography. These systems are designed to image a photomask at a reduced magnification onto a resist coated wafer. U.S. Pat. No. 5,052,763 to Singh et al. discloses a catadioptric optical system capable of high NA imaging. The '763 design creates a substantially flat image field over the large areas required for semiconductor lithography by having an input optical system with a curved field, a catadioptric relay system, and an output optical system to correct for the field curvature and some monochromatic aberrations. This design has several limitations including a limited working distance, internal pupil, narrow bandwidth, an internal beamsplitter, and tight manufacturing tolerances.

It is therefore an object of the present invention to provide an apparatus that has a long working distance between the optical system and the surface being inspected, a high numerical aperture, and small size.

It is also an object of the present invention to provide an apparatus that has a high degree of chromatic correction using a single glass material, where further chromatic correction can be achieved using at least one additional glass material, thereby making the apparatus suited for use at wavelengths in the deep UV and vacuum UV ranges.

It is still another object of the present invention to provide an apparatus with an external pupil plane to support apertureing and Fourier filtering.

It is another object of the present invention to provide an apparatus having relatively loose tolerances enabling manufacture for a reasonable cost.

It is another object of the present invention to provide an apparatus that has excellent image quality and a high degree of chromatic correction without the requirement to use aspherics, diffractive optics, beam splitters, or turning mirrors.

It is a further object of the present invention to provide an apparatus that is suited to support microscopic imaging and inspection applications at wavelengths in the UV to VUV spectral range.

It is another object of the present invention to provide an apparatus to support both broadband bright field and laser dark field imaging and inspection.

SUMMARY OF THE INVENTION

According to the present invention, there is provided a catadioptric objective having correction of image aberrations, chromatic variation of image aberrations, longitudinal (axial) color and lateral color, including residual (secondary and higher order) lateral color correction over a broad spectral range.

In previous systems, the order of the components, proceeding outwards from the high NA image formed by the system, is as follows: catadioptric cavity, intermediate image and field lens, focusing lens group. The present system reverses this previously employed ordering. The high NA image is next to the focusing lens group, then an intermediate image and field lens, then the catadioptric cavity. This reordering of components provides a relatively long free working distance around the high NA image as compared to previous systems.

In the previous component ordering scheme, the working distance is kept very short in order to minimize the central obscuration of the system. Reversing that order provides a long working distance while keeping a very small obscuration, and also retains color correction design aspects and characteristics found in designs using the previous component ordering scheme.

In addition to color correction, the present invention also includes an objective that can be used as microscope or as micro-lithography optics with a large numerical aperture, long working distance, and a large field of view. The objective is preferably telecentric and is a high performance objective with very small central obscuration, an external pupil for apertureing and Fourier filtering, and relatively loose manufacturing tolerances. The present invention is suited to both broad-band bright-field and laser dark field imaging and inspection at wavelengths below 350 nm.

These and other objects and advantages of the present invention will become apparent to those skilled in the art from the following detailed description of the invention and the accompanying drawings.

DETAILED DESCRIPTION OF THE INVENTION

This new configuration has several advantages over certain prior systems, such as that shown in U.S. Pat. No. 5,717,518. The present system has a long working distance, an external pupil for apertureing and Fourier plane filtering, very small central obscuration, very small system length, distortion correction, deep UV achromatism with just one glass type, and loose manufacturing tolerances. These advantages result from the novel arrangement of the Mangin mirrors and the presence of the two intermediate images in the system. Other advantages to this configuration include compact size, single optical axis, absence of aspherics, diffractive optics and strong curvature surfaces.

Figure 3:
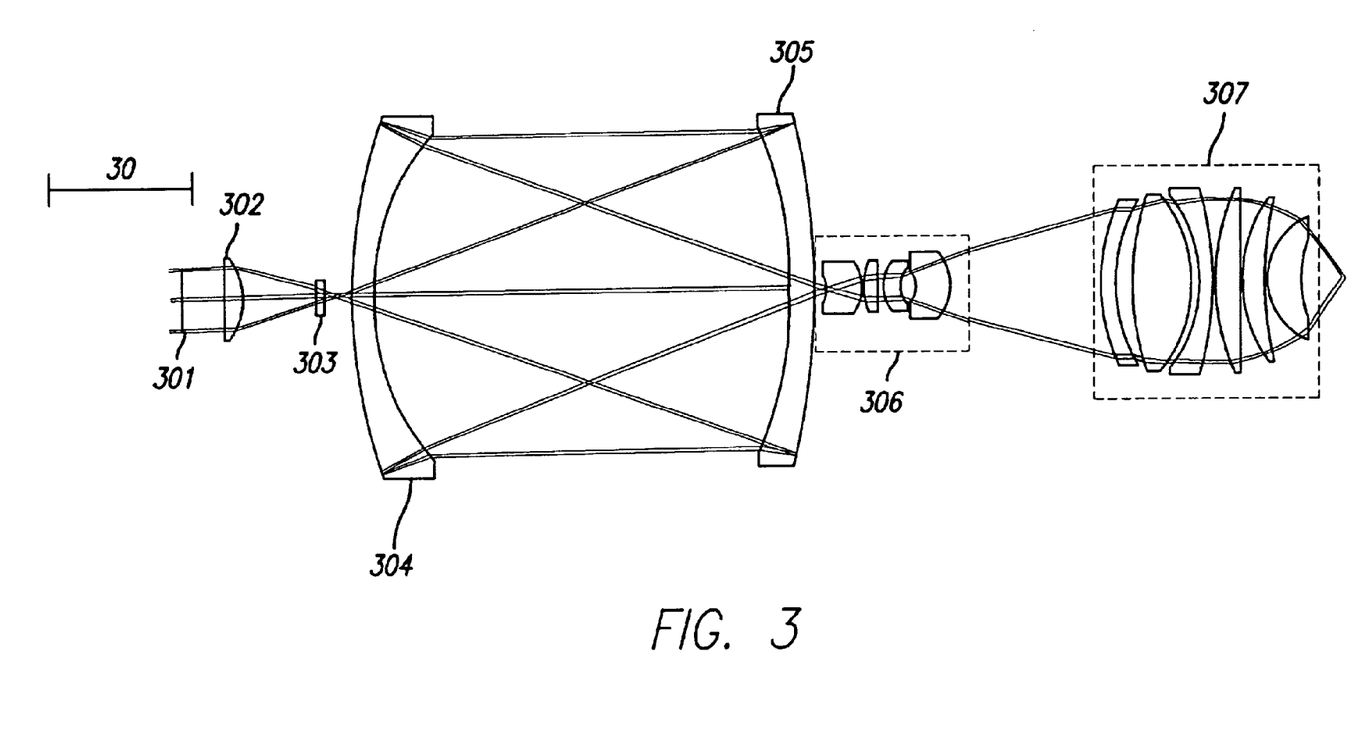
FIG. 3 illustrates an embodiment of the present invention having a 0.80 numerical aperture and a 7.5 mm working distance.

FIG. 3 illustrates the present design. The design of FIG. 3 has a 0.80 numerical aperture (NA) and a working distance of 7.5 mm, for use with an un-narrowed 193.3 nm excimer laser. All elements shown therein are formed from silica. A simple two lens third subsystem, shown on the left side of FIG. 3, enables collimation of the output of the catadioptric cavity. From FIG. 3, pupil plane 301 is to the left of the device. Light energy initially passes through lens 302, lens 303, and mangin mirrors 304 and 305, wherein light is reflected and transmitted through a hole in mangin mirror 305. Field lens group 306 and focussing lens group 307 serve to focus the light energy to the surface of the specimen (not shown) Field lens group 306 comprises first lens 306a, second lens 306b, third lens 306c, and fourth lens 306d. Focussing group 307 comprises first focussing lens 307a, second focussing lens 307b, third focussing lens 307c, fourth focussing lens 307d, fifth focussing lens 307e, and sixth focussing lens 307f.

Correcting the various color aberrations using a single glass type presents specialized concerns. Conventional designs usually use two or three glass types to correct color aberrations. The present invention corrects color aberrations using a single glass type due to the configuration of lens and mirror power. In the very deep UV range, both silica and $CaF_2$ are quite dispersive, so even a narrow spectral bandwidth at very short wavelengths can require the correction of quite a few distinct color aberrations. These may include: primary and secondary axial color, primary and secondary lateral color, chromatic variation of spherical aberration, and chromatic variation of coma.

The present optical system uses the Schupmann lens principle and the Offner field lens to correct for the primary axial and lateral color and the secondary axial color, as described in U.S. Pat. No. 5,717,518. The basic concept is to use the color generated by some lenses in a catadioptric cavity, with a small central obscuration to let light into and out of the cavity, to correct for the color introduced by a strong positive power focusing lens group. The present system uses one or more field lenses near the intermediate image, or between the catadioptric cavity and the focusing lens group, to image the catadioptric cavity onto the focusing lens group.

There are few glass materials that can be used for optical systems in the DUV-VUV spectral range. For a design intended for use near 193 nm, the lens material of choice is silica. For a similar design intended for use near 157 nm, that lens material is $CaF_2$. At 157 nm wavelength, for example, there is only $CaF_2$ as a reasonable material that does not have severe problems with birefringence, water solubility, or mechanical softness. Further chromatic correction can also be achieved using additional glass materials.

In principle, only one lens/mirror element is needed based on the color correcting principles applicable to this design, and the other element forming the catadioptric cavity could be a simple mirror. However, a two lens/mirror element arrangement offers advantages even if one lens/mirror element has little or no optical functional advantage over a simple mirror.

The present system has a nearly unit magnification catadioptric cavity that can be fashioned in a variety of sizes relative to the size of the focusing lens group. As the catadioptric cavity is made larger, the power of the lens part of the lens/mirror elements required for color correction of the system becomes weaker. This effect occurs because a large weak power lens can have the same amount of color as a stronger smaller size lens.

With respect to the small amount of central obscuration, the two lens/mirror elements forming the catadioptric cavity can have central holes to allow the light into and out of the cavity. A boundary is needed around the rim of the holes to prevent apertureing of the light and allow for optical polishing errors. This effectively increases the amount of obscuration.

Figure 4:
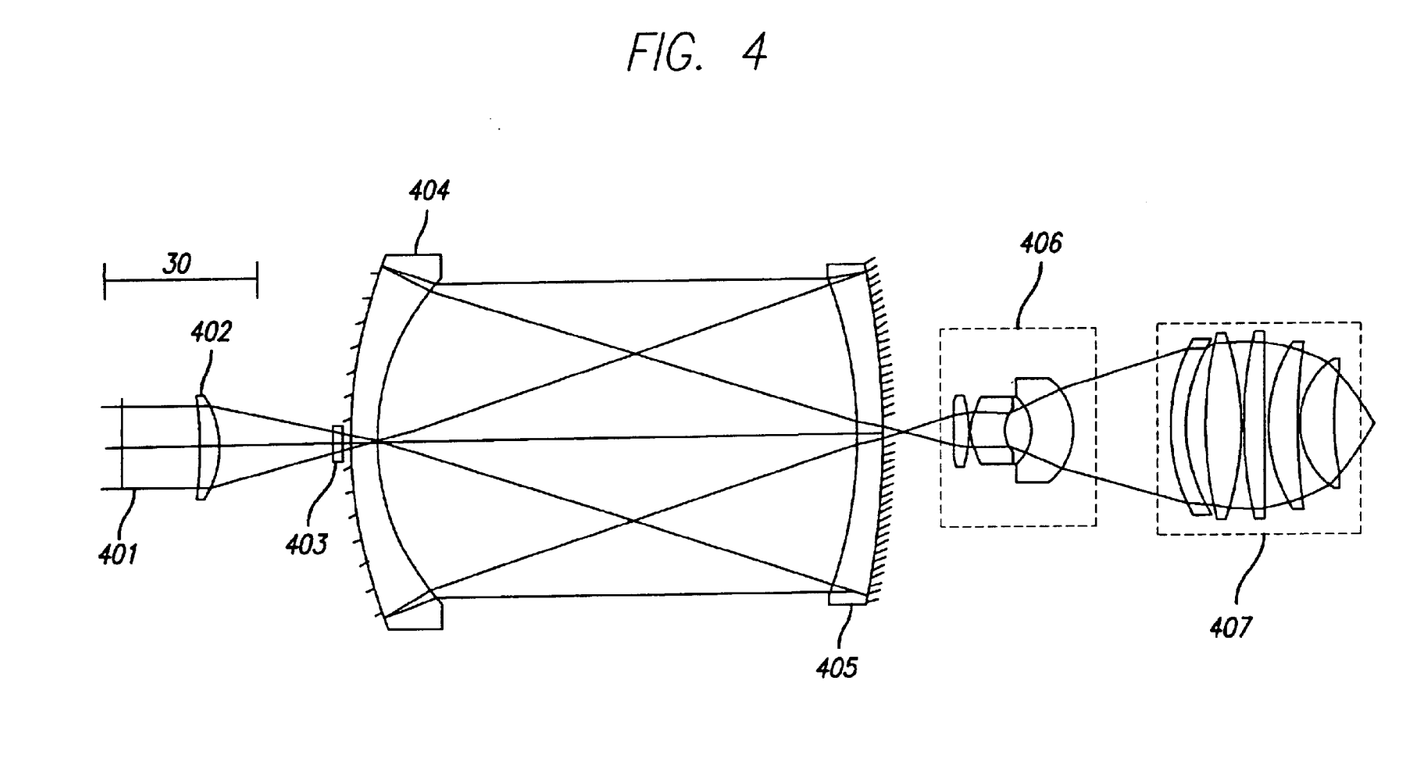
FIG. 4 is an alternate embodiment of the current invention employing a 193 nm optical design.

FIG. 4 illustrates an alternate arrangement without a central hole in either lens/mirror element. The reflective coating of each element includes a central hole. An extremely small boundary is required for a central hole in the reflective coating, and such a hole minimizes the amount of obscuration. This is important because a large central obscuration blocks low frequency information and reduces light level. The present design as shown in FIGS. 3 and 4 does not have a central obscuration problem and permits utilization of low frequency information.

The embodiment of FIG. 4 is a 193 nm catadioptric objective using a single glass material. In operation, light energy entering from the left and passing through an external pupil plane is focused by first lens or positive lens 402. A second lens or positive field lens 403 is positioned in front of the focus. Diverging light then proceeds to a catadioptric lens group formed by two Mangin mirrors 404 and 405. A Mangin mirror is a refractive lens/mirror element with a reflective back surface. The catadioptric group re-images the first image onto the second image near the second Mangin mirror 405 at unit magnification. The second field lens group 406 may optionally be placed near the second image. Field lens group 406 includes first, second, and third field lenses 406a–c. From there the light proceeds to the final focusing lenses 407. The focusing lens group includes first, second, third, fourth, and fifth focussing lenses 407a–e. This final focusing lens group 407 provides a relatively long working distance to the image.

This embodiment has a bandwidth of 1 nm with the central wavelength at 193.30 nm. The numerical aperture is 0.8, while the working distance is greater than 7 millimeters. The central obscuration is less than 5% in diameter at 0.8 NA. Even at 0.35 NA, the central obscuration is still below 16% in diameter, which is equivalent to 2.5% of area obscuration. The surface data for the first embodiment is listed in Table 1.

TABLE 1

Surface data of a 193 nm catadioptric design with a 1 nm bandwidth as shown in FIG. 4

| Surface # | Radius of curvature | Thickness | Glass |
| --- | --- | --- | --- |
| OBJ | Infinity | Infinity | Air |
| STO | Infinity | 15.188841 | Air |
| 2 | −81.627908 | 3.5 | Silica |
| 3 | −18.040685 | 22.449116 | Air |
| 4 | 18.74457 | 2 | Silica |
| 5 | 795.137592 | 1.998104 | Air |
| 6 | 84.996662 | 5 | Silica |
| 7 | 40.302422 | 97.532362 | Air |
| 8 | −78.567476 | 5 | Silica |
| 9 | −132.110046 | −5 | Reflector/Silica |
| 10 | −78.567476 | −97.532362 | Air |
| 11 | 40.302422 | −5 | Silica |
| 12 | 84.996662 | 5 | Reflector/Silica |
| 13 | 40.302422 | 97.532362 | Air |
| 14 | −78.567476 | 5 | Silica |
| 15 | −132.110046 | 14.180612 | Air |
| 16 | 41.906043 | 2.999944 | Silica |
| 17 | −19.645329 | 0.499948 | Air |
| 18 | 10.206534 | 6.643053 | Silica |
| 19 | 6.314274 | 5.385248 | Air |
| 20 | −6.571777 | 8.442713 | Silica |
| 21 | −11.608676 | 19.085531 | Air |
| 22 | 29.380754 | 2.999908 | Silica |
| 23 | 25.288697 | 4.186877 | Air |
| 24 | 55.554188 | 6.84081 | Silica |
| 25 | −51.735654 | 0.5 | Air |
| 26 | 53.425082 | 5.141563 | Silica |
| 27 | −275.827116 | 0.5 | Air |
| 28 | 27.209707 | 5.295973 | Silica |
| 29 | 85.400041 | 0.5 | Air |
| 30 | 13.757522 | 6.782701 | Silica |
| 31 | 69.464423 | 8.236734 | Air |
| IMA | Infinity | | |

The designs in these embodiments require certain tradeoffs for various features of the system based on different magnifications of the focusing lens subsystem, the magnification of the catadioptric cavity, and the size of the catadioptric cavity.

The diameter of the catadioptric cavity and the magnification of the focusing lens group determine the obscuration of the system. Use of a small magnification for the focusing lens group reduces the diameter of the intermediate image and keeps the obscuration due to the catadioptric cavity relatively small. If that is not done and the intermediate image size is large due to excessive magnification by the focusing lens group, then a larger diameter catadioptric cavity is necessary to have a particular amount of obscuration. The design shown in FIG. 4 has a relatively small catadioptric cavity due to a good choice of the magnification of the focusing lens group.

The catadioptric cavity can be fashioned in a variety of sizes relative to the size of the focusing lens group. As the catadioptric cavity is made larger, the power of the lens part of the lens/mirror elements required for color correction of the system becomes weaker. This effect occurs because a large weak power lens can have the same amount of color as a stronger smaller size lens.

Properly controlling the size and magnification of the catadioptric cavity allows the catadioptric cavity to correct for spherical aberration. If the cavity magnification is near one-to-one, the spherical aberration of the cavity is minimized. By changing the catadioptric cavity magnification and size, spherical aberration can be generated to compensate for the spherical aberration of other system components.

Another effect of the combination of the sizes of elements of the catadioptric cavity relative to the size of the focusing lens subsystem and the magnification of the focusing lens subsystem is the Petzval curvature correction of the system. The catadioptric cavity partly corrects for the strong Petzval curvature of the focusing lens subsystem. The smaller the catadioptric cavity is, the stronger its elements and the more completely the catadioptric cavity cancels the Petzval curvature of the focusing lens group. Cancellation of the Petzval curvature of the focusing lens group may alternately be accomplished by use of several negative lenses in the focusing lens subsystem. The relative amount of Petzval correction of the complete system by the catadioptric cavity, compared with the amount of Petzval correction by the negative lenses in the focusing lens subsystem, affect the ability to perform certain unrelated design tasks.

In addition it is desirable to have an optical design that can be easily manufactured with a reasonable cost. Typically this requires low optical and mechanical tolerances and a small size. To reduce the total length of the optical system requires a short catadioptric cavity and a low magnification focusing lens group. It is possible to achieve a design with small obscuration, good monochromatic aberration correction, good color correction, small size, and low tolerances by properly choosing the size and magnification of the catadioptric cavity and the focusing lens group.

The design is telecentric on the high NA image end, and also has an external entrance pupil. Ideally the pupil is located a relatively significant distance from the nearest lens to provide an accessible Fourier plane and allow for the insertion of a beam splitter. These two constraints on entrance and exit pupil positions of the system affect the Petzval correction distribution within the system and the lateral color correction of the system. As has been described, multiple interreactions occur within the present optical system, and thus the embodiments shown exhibit a delicate balance between the optimum catadioptric cavity and the construction of the particular focusing lens subsystem.

The present optical system design has an external pupil plane to support apertureing and Fourier filtering. The system may optionally employ an aperture to control the NA of the imaging system. Use of such an aperture enables control of the resolution and depth of focus.

The present optical system also has reasonable tolerances so it can be more easily manufactured. Certain previously known high NA, broad bandwidth systems include optical elements having very tight position and thickness tolerances. These tight tolerances frequently make the design too expensive or even impossible to build in a production environment.

Figure 5:
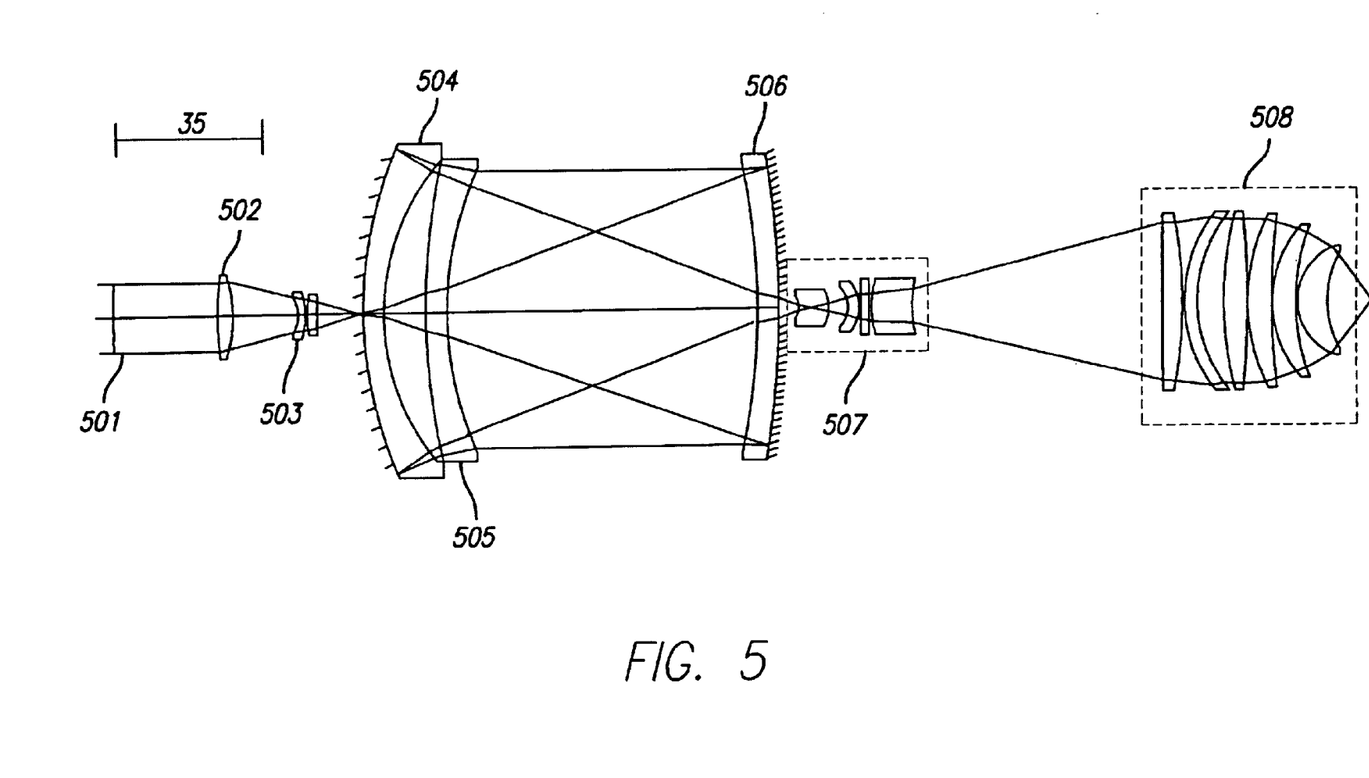
FIG. 5 is a further embodiment of the current invention with an emphasis on loose tolerances.

The second embodiment of the current invention is shown in FIG. 5. The design of FIG. 5 is a more complex version of the 193 nm optical design with emphasis on loose tolerances. From FIG. 5, light energy passes pupil plane 501 to first lens 502 and field lens group 503 to mangin mirror 504 and lens 505. Light energy reflects between the mangin mirror 504 and mangin mirror 506 before leaving through the hole in mangin mirror 506. Light then passes through field lens group 507, including first through fourth field lenses 507a through 507d, and focussing lens group 508, including first through sixth focusing lenses 508a through 508f.

One major difference between the design of FIG. 4 and that of FIG. 5 is the addition of a lens 505 inside the catadioptric cavity. The extra lens 505 enables simple modification of higher-order aberrations and results in diminished requirements for the field lens group 507. The resulting field lens group 507 exhibits decreased tolerance sensitivity compared with previous designs. The result is that every element in the design shown in FIG. 5 can be decentered by +/−5 microns, and less than 0.07 waves r.m.s. of on-axis coma is introduced. The 15 mm-diameter pupil 501 is 25 mm from the first lens 502, thereby more readily enabling Fourier filtering. The surface data of the design shown in FIG. 5 is listed in Table 2.

TABLE 2

Surface data of a 193 nm catadioptric design with improved tolerance as shown in FIG. 5

| Surface # | Radius of curvature | Thickness | Glass |
|---|---|---|---|
| OBJ | Infinity | Infinity | Air |
| STO | Infinity | 25 | Air |
| 2 | 91.85042 | 3.5 | Silica |
| 3 | −24.379754 | 15.135303 | Air |
| 4 | −12.478841 | 2 | Silica |
| 5 | −16.341363 | 0.5 | Air |
| 6 | 20.417844 | 2 | Silica |
| 7 | −619.526297 | 11.13089 | Air |
| 8 | 81.628617 | 5 | Silica |
| 9 | 46.38262 | 10.124973 | Air |
| 10 | 135.620838 | 5 | Silica |
| 11 | 73.040816 | 73.826866 | Air |
| 12 | −125.932264 | 5 | Silica |
| 13 | −164.108468 | −5 | Reflector/Silica |
| 14 | −125.932264 | −73.826866 | Air |
| 15 | 73.040816 | −5 | Silica |
| 16 | 135.620838 | −10.124973 | Air |
| 17 | 46.38262 | −5 | Silica |
| 18 | 81.628617 | 5 | Reflector/Silica |
| 19 | 46.38262 | 10.124973 | Air |
| 20 | 135.620838 | 5 | Silica |
| 21 | 73.040816 | 73.826866 | Air |
| 22 | −125.932264 | 5 | Silica |
| 23 | −164.108468 | 4.997981 | Air |
| 24 | −7.217097 | 7.368018 | Silica |
| 25 | −8.200826 | 4.888611 | Air |
| 26 | −5.753897 | 2.495664 | Silica |
| 27 | −7.26511 | 0.49962 | Air |
| 28 | −116.880084 | 2 | Silica |
| 29 | −41.098609 | 0.537963 | Air |

TABLE 2-continued

Surface data of a 193 nm catadioptric design with improved tolerance as shown in FIG. 5

| Surface # | Radius of curvature | Thickness | Glass |
|---|---|---|---|
| 30 | 21.822865 | 9.566301 | Silica |
| 31 | 19.261704 | 59.973849 | Air |
| 32 | 674.092453 | 4.5 | Silica |
| 33 | −107.489747 | 0.5 | Air |
| 34 | 27.666171 | 2.998671 | Silica |
| 35 | 25.945185 | 6.495392 | Air |
| 36 | 74.468846 | 5.52337 | Silica |
| 37 | −174.813731 | 0.5 | Air |
| 38 | 39.024119 | 5.297476 | Silica |
| 39 | 119.056539 | 0.5 | Air |
| 40 | 22.33152 | 5.527379 | Silica |
| 41 | 37.203165 | 0.5 | Air |
| 42 | 12.178229 | 6.998013 | Silica |
| 43 | 20.810308 | 10.113383 | Air |
| IMA | Infinity | | |

The above 193 nm catadioptric optical systems can be further chromatically corrected by using calcium fluoride lens elements, especially by placing such lens elements in the field lens group. These calcium fluoride lens elements achromatize the field lens group and further increase the optical bandwidth.

Figure 6:
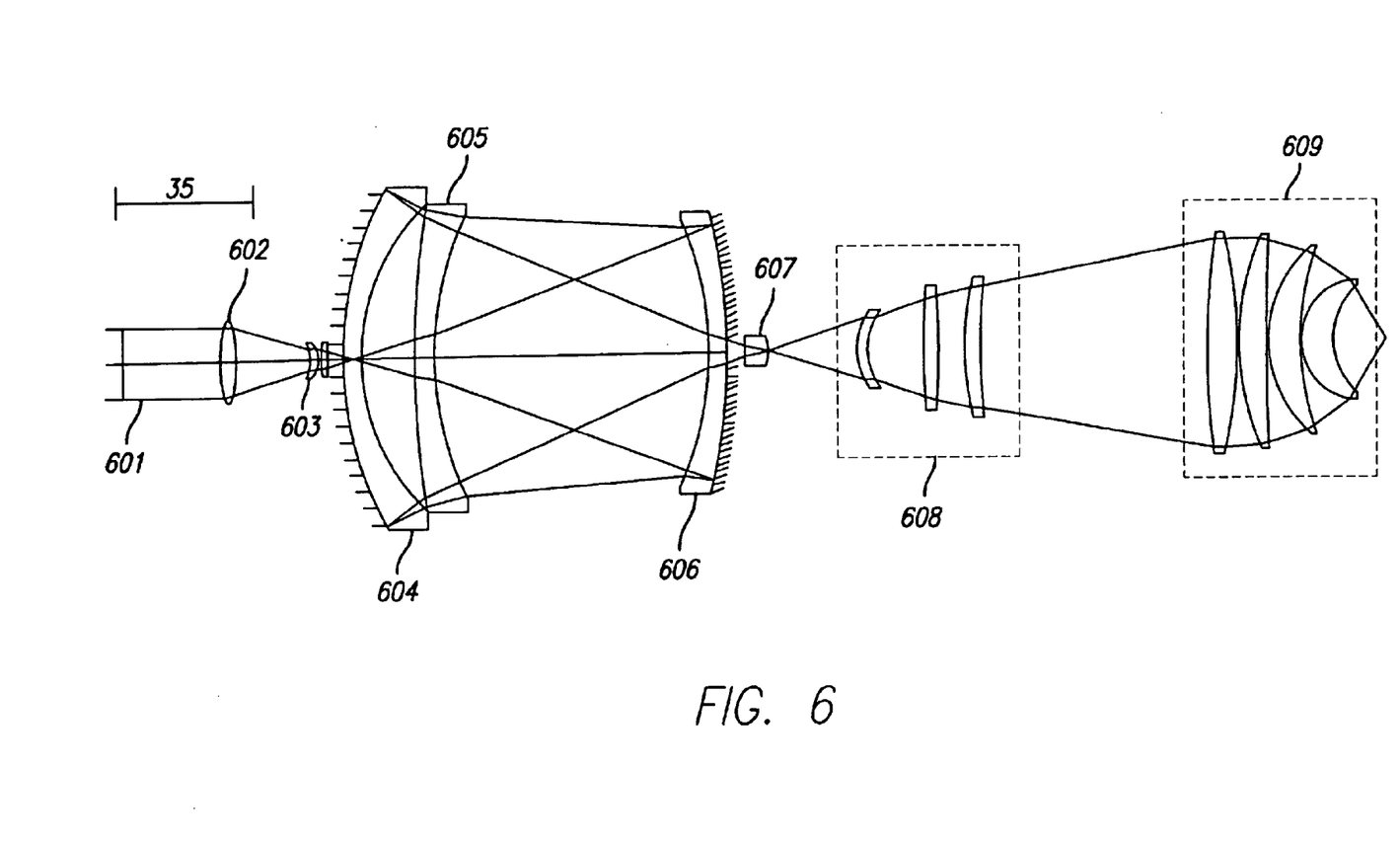
FIG. 6 illustrates an alternate embodiment of the current invention having a 0.85 numerical aperture for a 157 nm optical design.

The third embodiment of the present invention is a 0.85 NA design for 157 nm and is shown in FIG. 6. From FIG. 6, pupil plane 601 is to the left of first lens 602 and field lens group 603. Light energy passing through first lens 602 and field lens group 603 is directed to mangin mirror 604, lens 605, mangin mirror 606, lens 607, field lens group 608, and focussing lens group 609. Field lens group 608 comprises first through third lenses 608a through 608c and focussing lens group 609 comprises first through sixth lenses 609a through 609f.

The field sizes for the 0.85 NA and the 0.386 NA modes of operation are 0.264 mm diameter and 0.58 mm diameter, respectively. A +/−5 microns decenter of any element leaves the on-axis Strehl value above 0.80, and the arrangement shown in FIG. 6 has been optimized for this decentering. Addition of compensation elements provides for variances in manufacturing tolerances without appreciable degradation. The surface data for one example of the type of design presented in FIG. 6 is listed in Table 3.

TABLE 3

Surface data of a 157 nm catadioptric design with a 0.2 nm bandwidth for the embodiment of FIG. 6

| Surface # | Radius of curvature | Thickness | Glass |
|---|---|---|---|
| OBJ | Infinity | Infinity | Air |
| STO | Infinity | 25 | Air |
| 2 | 33.695296 | 4 | CAF2 |
| 3 | −37.093413 | 18.962478 | Air |
| 4 | −8.620183 | 2 | CAF2 |
| 5 | −10.369405 | 0.5 | Air |
| 6 | 11.074443 | 2 | CAF2 |
| 7 | 21.480782 | 3.99975 | Air |
| 8 | 78.490827 | 5 | CAF2 |
| 9 | 47.787034 | 13.247601 | Air |
| 10 | 178.58276 | 5 | CAF2 |
| 11 | 72.427167 | 71.003404 | Air |
| 12 | −73.55544 | 5 | CAF2 |

TABLE 3-continued

Surface data of a 157 nm catadioptric design with a 0.2 nm bandwidth for the embodiment of FIG. 6

| Surface # | Radius of curvature | Thickness | Glass |
|---|---|---|---|
| 13 | −131.363604 | −5 | Reflector/Silica |
| 14 | −73.55544 | −71.003404 | Air |
| 15 | 72.427167 | −5 | CAF2 |
| 16 | 178.58276 | −13.247601 | Air |
| 17 | 47.787034 | −5 | CAF2 |
| 18 | 78.490827 | 5 | Reflector/Silica |
| 19 | 47.787034 | 13.247601 | Air |
| 20 | 178.58276 | 5 | CAF2 |
| 21 | 72.427167 | 71.003404 | Air |
| 22 | −73.55544 | 5 | CAF2 |
| 23 | −131.363604 | 4.999004 | Air |
| 24 | −10.2578 | 5.565984 | CAF2 |
| 25 | −10.504881 | 22.77639 | Air |
| 26 | 13.922164 | 2.498855 | CAF2 |
| 27 | 13.063636 | 14.648618 | Air |
| 28 | 176.911005 | 4 | CAF2 |
| 29 | −153.13093 | 6.591557 | Air |
| 30 | 71.277073 | 4 | CAF2 |
| 31 | 150.529695 | 58.60825 | Air |
| 32 | 158.344855 | 7.324261 | CAF2 |
| 33 | −105.293511 | 0.499719 | Air |
| 34 | 54.468603 | 7.222634 | CAF2 |
| 35 | 330.201607 | 0.5 | Air |
| 36 | 26.746267 | 7.815818 | CAF2 |
| 37 | 46.758643 | 0.5 | Air |
| 38 | 13.839957 | 8.581743 | CAF2 |
| 39 | 15.918572 | 13.159604 | Air |
| IMA | Infinity | | |

The optical designs described in the previous embodiments enable photomask and wafer imaging and inspection at wavelengths of 193 nm and 157 nm. Designs optimized for other UV wavelengths such as 365, 351, 266, 248, and 126 nm and shorter wavelengths as well as those supporting multiple wavelengths can be obtained by those skilled in the art using the optical designs and approaches presented in these embodiments.

The previous embodiments of the current invention have a long working distance between the optics and the surface being inspected, a high numerical aperture, and a small central obscuration. A long working distance is essential for certain applications such as photomask inspection and laser dark-field inspection. Photomask inspection requires the working distance of the imaging system to be greater than 7 mm because of the protective pellicle on the photomask. A long working distance is also desirable for performing inspections in a laser dark-field environment. Use of a long working distance enables direct illumination from outside the objective of the surface being inspected. A high numerical aperture provides resolution imaging and collecting as large a solid angle as possible. Employing the design of the present system enables numerical apertures of 0.8 with excellent performance. A numerical aperture of 0.8 corresponds to collecting angles above the surface from normal to 53 degrees.

Figure 7:
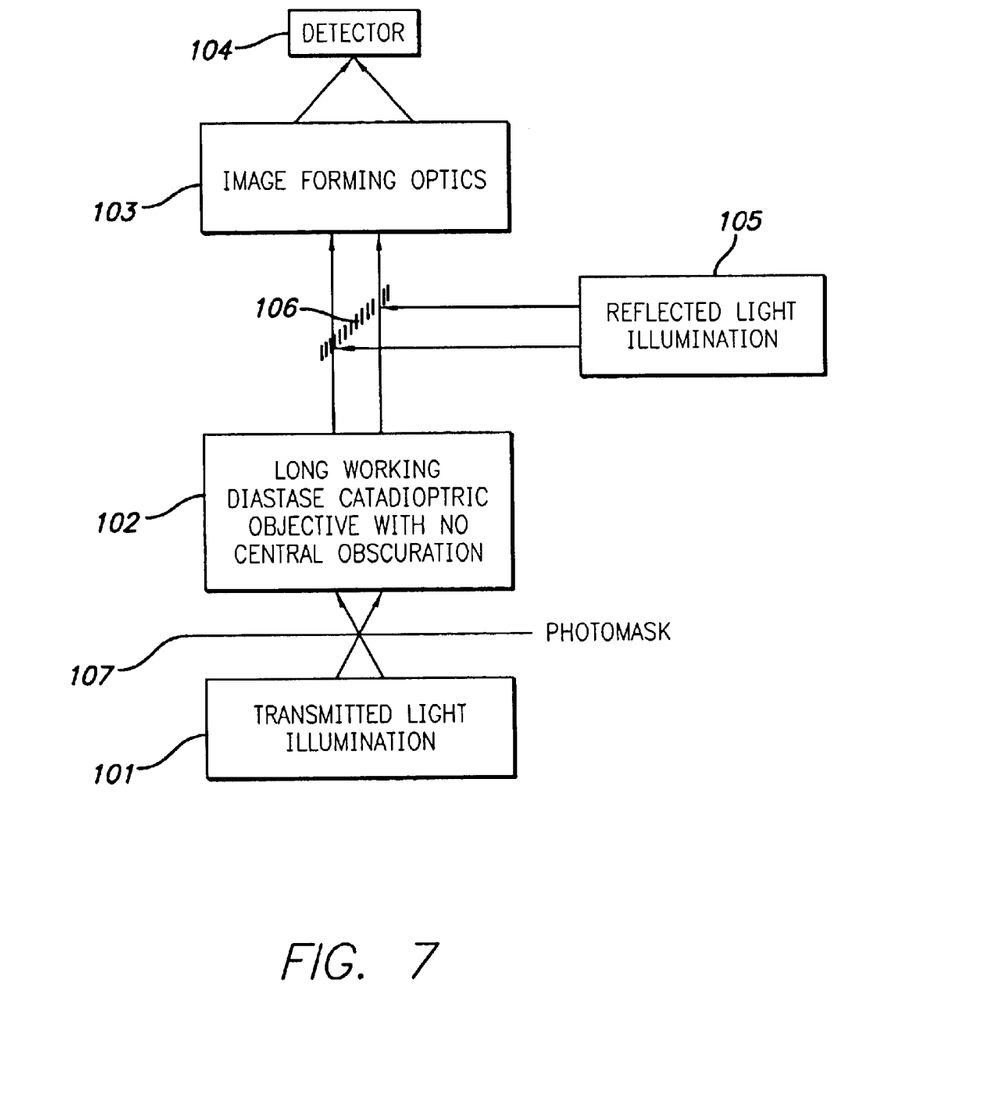
FIG. 7 presents a conceptual embodiment of the current invention.

An additional embodiment of the apparatus allows for photomask inspection below 250 mm. This 250 nm embodiment is illustrated in FIG. 7. The apparatus of FIG. 7 consists of illumination optics 101, a long working distance catadioptric imaging objective 102, image forming optics 103, detector 104, and reflected light illumination 105. Catadioptric imaging designs using the design of FIG. 7 and employing a single glass material are possible when using an illumination source having a bandwidth less than or equal to 1 nm. Designs using two glass materials are possible when using an illumination source having a bandwidth greater than 1 nm.

The illumination source can be a variety of different types. For example, an un-narrowed excimer laser, a lamp with a bandpass filter, or a frequency converted laser can each produce light with a 1 nm bandwidth or less. An unfiltered lamp or lamp with a larger bandpass filter, such as an excimer lamp or a deuterium lamp, are also available sources for a bandwidth greater than 1 nm. It can be particularly difficult to find a suitable light source at 193 nm and 157 nm because there are few light sources available at these wavelengths. The type of illumination can be either transmitted or reflected light or both. The transmitted light for illumination system of the present design uses a condenser objective. The condenser objective does not require high optical quality because the objective is only used for illumination. The illumination for reflected light uses a beamsplitter and is implemented as typically done in a standard microscope.

The long working distance imaging objective for the design of FIG. 7 is similar or identical to those described in FIGS. 4–6. The objective has a long working distance, is highly corrected for all aberrations, and has a large field of view. It is also advantageous for the objective to be unobscured. The long working distance is provides clearance for the protective pellicle included on the photomask. This pellicle is typically located about 6 mm above the mask surface, and performs the function of preventing dust and other contamination from reaching the photomask surface. For this reason, the objective working distance ids designed to be greater than 6 mm so it will not interfere with the pellicle. The objective is also well corrected for aberrations over the bandwidth of the illumination source.

Most commonly available illumination sources have a bandwidth greater than the 1–2 pm bandwidth obtained from a standard type single material all refractive objective design. The catadioptric designs in FIGS. 4–6 address this problem. The objective is also capable of imaging over a large field. Large fields and high data acquisition rates make inspecting the photomask as fast as possible.

The image forming optics are corrected over the bandwidth of the catadioptric imaging objective. These image forming optics also can achieve the various magnifications required by a photomask inspection system. One technique for designing the image forming optics is to have the image forming optics and the catadioptric objective fully corrected for aberrations. Full correction for aberrations permits testing of image forming optics and separate testing of the catadioptric objective. Aberration correction may alternatively be shared between the catadioptric objective and the image forming optics. Such an optical design, while structurally simpler, can complicate the testing of the image forming optics and the catadioptric objective.

The detector is a high speed detector capable of the high data rates used for an inspection system. One detector applicable to the current system is a single point diode type detector or an area type detector such as a CCD or a CCD operating in the Time Delay and Integration (TDI) mode. Such a detector should have a high quantum efficiency, low noise, and a good Modulation Transfer Function (MTF).

Figure 8:
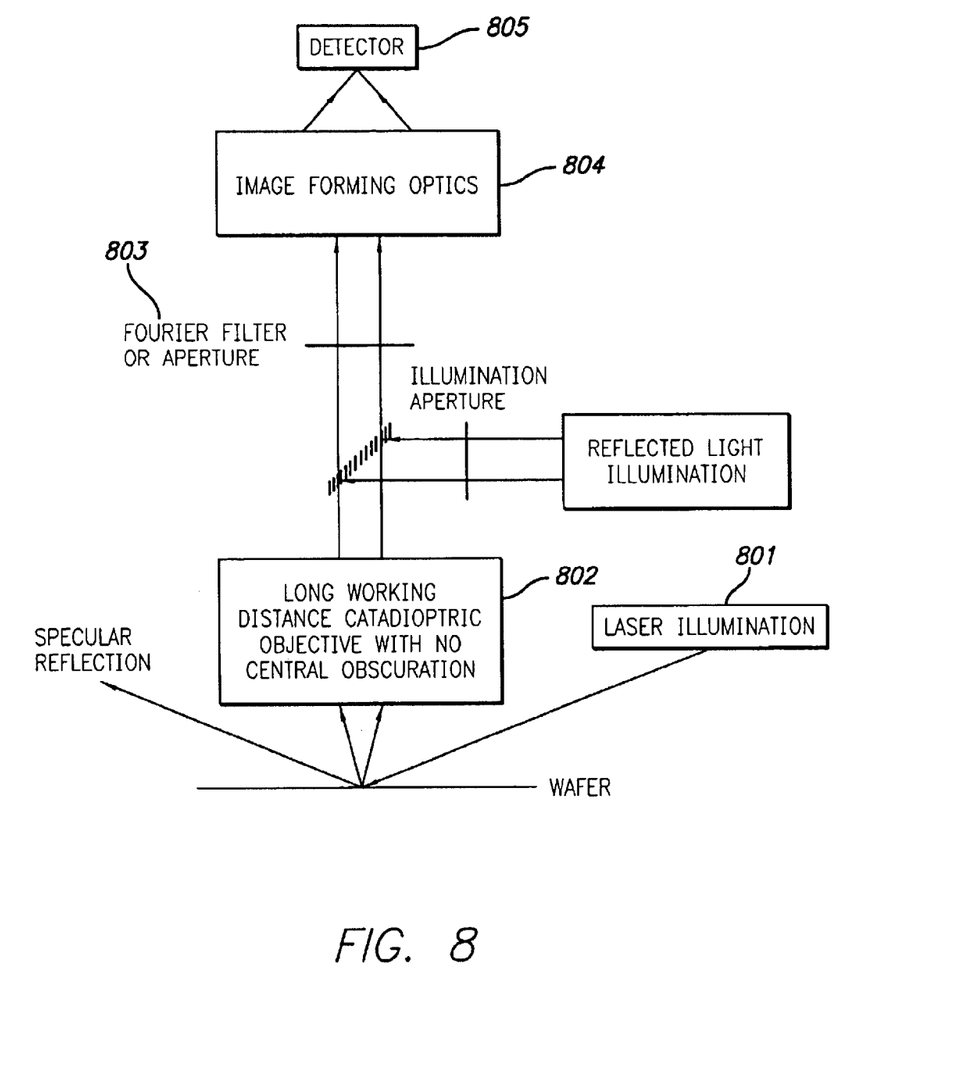
FIG. 8 illustrates a conceptual view of a laser dark-field inspection apparatus.

An alternate embodiment uses the current optical system invention as an apparatus for laser dark-field wafer inspection below 266 nm. This embodiment is illustrated in FIG. 8. This apparatus consists of illumination optics 801, a long working distance catadioptric imaging objective 802, a Fourier filter or aperture 803 at the external pupil plane, image forming optics 804, and a detector 805. Catadioptric imaging designs incorporating the design of FIG. 8 using a single glass material are possible when using an illumination source having a bandwidth of 1 nm or less. Catadioptric imaging designs incorporating the design of FIG. 8 using two glass materials are possible when using an illumination source with a bandwidth greater than 1 nm.

The types of illumination that can be used for this system are similar to those of the design presented in FIG. 7 for photomask inspection. The preferred source is a laser for directionality and brightness. The preferred type of laser-dark field illumination is direct illumination of the wafer from outside the objective. Only light scattered from the wafer is collected by the catadioptric objective. The specularly reflected beam is beyond the numerical aperture of the objective and is not collected.

The long working distance imaging objective is similar to the imaging objectives described in FIGS. 4-6. As with photomask inspection, it is desirable for an objective used for laser directional dark-field inspection to have a long working distance, be highly corrected for all aberrations, have a large field of view, and an easily accessible pupil plane. It is also advantageous for the objective to have very small obscuration. The long working distance makes it relatively simple to deliver laser energy to the wafer from outside the objective without interfering with the operation of the imaging system. The objective should also be well corrected for aberrations over the bandwidth of the illumination source. Most of the available illumination sources have a bandwidth greater than the 1–2 pm bandwidth obtained from a standard type of single material all refractive objective design. The catadioptric designs in embodiments 1–5 address this problem. The objective is also capable of imaging over a large field. Large fields and high data acquisition rates are essential to inspect the photomask as fast as possible. The objective also has an easily accessible pupil plane to support Fourier filtering or aperturing. Fourier filtering can reduce the noise caused by repeating patterns on the wafer, thereby increasing the signal-to-noise of defects on the surface.

The image forming optics are corrected over the bandwidth of the catadioptric imaging objective and are also capable of the various magnifications required by a wafer inspection system. The image forming and the catadioptric objective can each be fully corrected for aberrations, enabling testing of image forming optics and the catadioptric objective as separate units. Another technique is to share aberration correction between the catadioptric objective and the image forming optics. The optical design for this approach can be simpler, but it can complicate testing of the image forming optics and the catadioptric objective.

The detector is preferably a high speed detector capable of the high data rates used for an inspection system. One applicable detector is a single point diode type detector or an area type detector such as a CCD or a CCD operating in the Time Delay and Integration (TDI) mode. This detector has a high quantum efficiency, low noise, and a good Modulation Transfer Function (MTF).

The opaqueness of CMP (Chemical Mechanical Planarization) layers in the DUV (deep ultraviolet range) makes a system using this objective well suited to finding surface defects and microscratches. The present design is also well suited for use as a lithography lens or used for lithography simulation and can be used as a research and development tool for micro-electronic development. This design may be employed in biological settings where a long working distance is needed between the optics and the sample. The design is also applicable for wavelengths in the range from visible to DUV to VUV. For this reason it is well suited for fluorescence measurements.

As with many DUV-VUV optical systems, it is often required to purge the optical path with a high purity gas, or maintain the optical path in a partial vacuum. The main reasons for this are optical absorption and damage. At short wavelengths, especially below 200 nm, many materials are highly absorbing including oxygen, water, hydrocarbons, outgasing from epoxies and urethanes, and residues from cleaning solvents. These materials, can absorb light and reduce transmission. Many materials can also be photolitically deposited on surfaces. These surfaces then become absorbing and have their transmission greatly reduced and even become damaged.

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. A method of imaging an object, comprising:
    collecting light from said object with a focussing lens group;
    correcting chromatic aberration by use of a catadioptric group; and
    passing said light through a field lens group located between said focussing lens group and said catadioptric group;
    wherein said catadioptric group comprises a plurality of Mangin reflective elements and said light collecting occurs at a numerical aperture of in excess of 0.8.

2. The method of claim 1, wherein said focussing lens group is separated from said object by at least 2 mm.

3. The method of claim 1, wherein said object is a reticle, and a pellicle is located between said reticle and said focussing lens group.

4. The method of claim 1, wherein said focussing lens group, said catadioptric group, and said field lens group are arranged along a common optical axis.

5. The method of claim 1, wherein said focussing lens group is located between said object and said field lens group.

6. The method of claim 1 where the catadioptric group at least partially corrects for spherical aberration.

7. A catadioptric optical system comprising:
    a focusing lens group at a high numerical aperture end of said system;
    a catadioptric group for at least partially correcting chromatic aberration, said catadioptric group comprising a plurality of Mangin reflective elements; and
    a field lens group located along an optical path between said focusing lens group and said catadioptric group.

8. The system of claim 7, wherein at least one of said lens groups comprises a lens made of silica.

9. The system of claim 7, wherein said system has a designed center wavelength of 193 mm.

10. The system of claim 7, wherein at least one of said lens groups comprises a lens made of calcium fluoride.

11. The system of claim 7, wherein said system has a designed center wavelength of 157 nm.

12. The system of claim 7, wherein said light has at least a 1 pm bandwidth.

13. The system of claim 7, wherein said light has at least a 2 pm bandwidth.

14. The system of claim 7, wherein said catadioptric group comprises a pair of curved reflective elements.

15. The system of claim 14, wherein said catadioptric group further comprises a transmissive element located between said reflective elements.

16. The system of claim 7, wherein substantially all of the optical elements comprise spherical optics.

17. The system of claim 7, wherein said system is free of aspherical optical elements.

18. The system of claim 7, wherein said system is used to image an object maintained in a moisture and oxygen free ambient environment.

19. The system of claim 18, wherein said ambient environment comprises a vacuum.

20. The system of claim 7 where the catadioptric group at least partially corrects for spherical aberration.

21. A catadioptric optical system having a working distance between optical components and a specimen, comprising:
   a catadioptric group comprising a plurality of Mangin elements and having a relatively high degree of chromatic correction; and
   image forming optics producing an image of a surface being examined;
   wherein said working distance is at least 2 mm, and further wherein said catadioptric optical system exhibits a numerical aperture in excess of 0.8.

22. The system of claim 21, wherein said chromatic correction is provided over a range of wavelengths in the DUV or VUV range.

23. The system of claim 22, wherein said range of wavelengths is at least 1 pm in width.

24. The system of claim 22, wherein said range of wavelengths is at least 2 pm in width.

25. The system of claim 22, wherein said chromatic correction is provided for higher order chromatic aberration.

26. The system of claim 22, wherein said system additionally corrects for spherical aberration, coma and astigmatism.

27. The system of claim 26, wherein said spherical aberration, coma and astigmatism are at least partially corrected by said image forming optics.

28. The system of claim 22, wherein said system corrects for at least secondary longitudinal color and primary and secondary lateral color.

29. The system of claim 28, wherein said correction is performed in the DUV or VUV range over a bandwidth of at least 1 pm.

30. The system of claim 28, wherein said secondary longitudinal color and primary and secondary lateral color are at least partially corrected by said image forming optics.

31. The system of claim 22, wherein a working distance is used to separate a photomask from said system, and wherein there is a pellicle between said photomask and said system.

32. The system of claim 22, wherein said system is designed with loose manufacturing tolerances.

33. The system of claim 32, wherein said manufacturing tolerances permit elements within the system to be decentered to within 5 microns.

34. The system of claim 33, wherein said decentering produces less than 0.07 waves r.m.s of on-axis coma.

35. The system of claim 32 wherein said manufacturing tolerances permit all elements within the system to be decentered to within 5 microns.

36. An apparatus for photolithographically imaging a semiconductor wafer, comprising:
   a focusing lens group at a high numerical aperture end of said apparatus;
   a catadioptric group for at least partially correcting chromatic aberration; and
   a field lens group located along an optical path between said focusing lens group and said catadioptric group;
   wherein said catadioptric group comprises a plurality of Mangin elements and said apparatus is configured to have a numerical aperture in excess of 0.8.

37. The apparatus of claim 36, wherein said wafer is separated from said apparatus by a distance sufficient to purge oxygen and moisture from a region separated from said wafer.

38. The apparatus of claim 37, wherein said region is maintained in a vacuum.

* * * * *